US009275665B2

(12) United States Patent
Dinh et al.

(10) Patent No.: US 9,275,665 B2
(45) Date of Patent: Mar. 1, 2016

(54) SLIDER WITH HIGH FREQUENCY VOLTAGE GROUND AND LOW FREQUENCY DC VOLTAGE ISOLATION

(71) Applicant: HGST Netherlands B.V., Amsterdam (NL)

(72) Inventors: Tuan M. Dinh, San Jose, CA (US); David P. Druist, Santa Clara, CA (US); David J. Seagle, Morgan Hill, CA (US); Michael M. H. Yang, Campbell, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/341,701

(22) Filed: Jul. 25, 2014

(65) Prior Publication Data

US 2016/0027459 A1    Jan. 28, 2016

(51) Int. Cl.
*G11B 5/60* (2006.01)
*G11B 5/48* (2006.01)
*H01L 49/02* (2006.01)
*H01L 21/311* (2006.01)
*H01L 21/285* (2006.01)
(Continued)

(52) U.S. Cl.
CPC ............ *G11B 5/4846* (2013.01); *G11B 5/6082* (2013.01); *H01L 21/02271* (2013.01); *H01L 21/28568* (2013.01); *H01L 21/31105* (2013.01); *H01L 27/0248* (2013.01); *H01L 28/20* (2013.01); *H01L 28/60* (2013.01)

(58) Field of Classification Search
CPC ............ G11B 5/60; G11B 5/33; G11B 5/147; G11B 5/127; G11B 5/6082

USPC ......... 360/234.4, 234.5, 125.3, 125.03, 324.1
See application file for complete search history.

(56) References Cited

U.S. PATENT DOCUMENTS 4,155,263 A * 5/1979 Frantz ............................. 73/771
6,870,696 B2 * 3/2005 Cheung et al. .................. 360/46
(Continued)

FOREIGN PATENT DOCUMENTS

EP    1014342    6/2000
EP    1045385    10/2000
WO    9820485    5/1998

OTHER PUBLICATIONS

Klaassen et al., "Write-to-Read Coupling," IEEE Transactions on Magnetics, vol. 38, Issue 1, Jan. 2002, pp. 61-67, Abstract Only.

*Primary Examiner* — Allen T Cao
(74) *Attorney, Agent, or Firm* — Zilka-Kotab, PC

(57) ABSTRACT

In one embodiment, a slider includes a substrate, a magnetic head, and a coupling capacitor. In one embodiment, a slider includes a substrate, a magnetic head, and a coupling capacitor configured to AC couple an electronics ground of the slider to the substrate and DC decouple the electronics ground of the slider from the substrate, the coupling capacitor including: a first conductive layer, a gap layer positioned above the first conductive layer, a dielectric layer positioned above the gap layer and the first conductive layer, and a second conductive layer positioned above the dielectric layer. In another embodiment, a method for forming a capacitor includes forming a substrate, forming a first conductive layer above the substrate, forming a gap layer above the first conductive layer, forming a dielectric layer above the gap layer and the first conductive layer, and forming a second conductive layer above the dielectric layer.

23 Claims, 13 Drawing Sheets

(51) Int. Cl.
*H01L 21/02* (2006.01)
*H01L 27/02* (2006.01)

(56) References Cited

U.S. PATENT DOCUMENTS

| | | |
|---|---|---|
| 7,050,268 B2 | 5/2006 | Kikuchi et al. |
| 7,573,677 B2 | 8/2009 | Nikitin et al. |
| 8,531,800 B1 | 9/2013 | Contreras et al. |
| 8,879,189 B2 * | 11/2014 | Miyamoto et al. ............. 360/55 |
| 2003/0016077 A1 * | 1/2003 | McMahon et al. ........... 327/538 |
| 2005/0088772 A1 * | 4/2005 | Baumgart et al. ............. 360/75 |
| 2006/0119971 A1 * | 6/2006 | Kurita et al. .................... 360/69 |
| 2007/0076322 A1 * | 4/2007 | Choi et al. ................. 360/234.4 |
| 2013/0163110 A1 | 6/2013 | Garzon et al. |

* cited by examiner

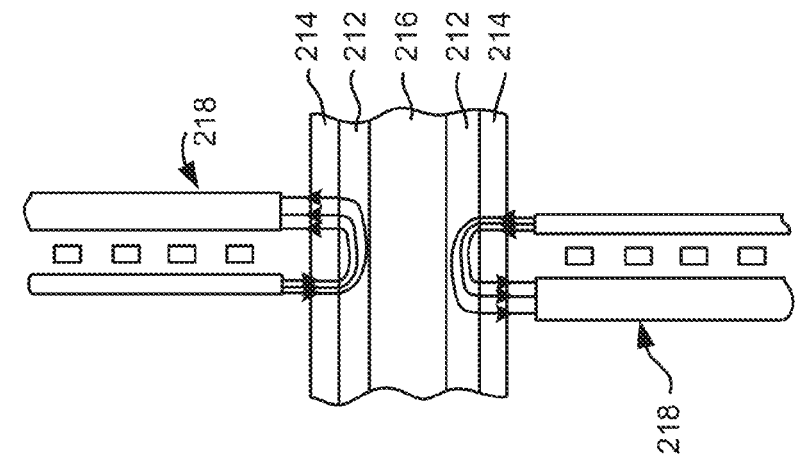
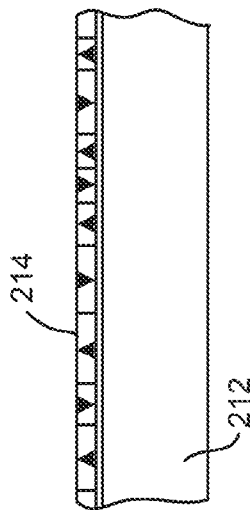
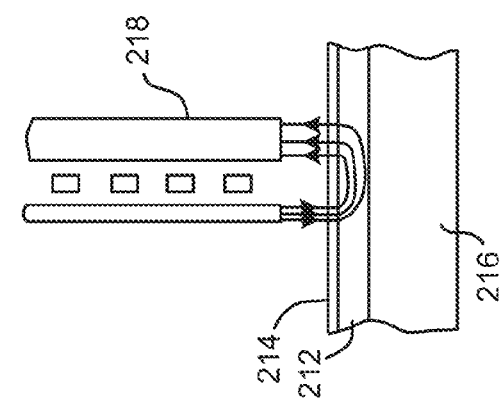
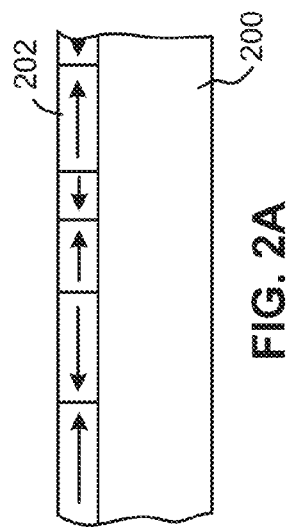
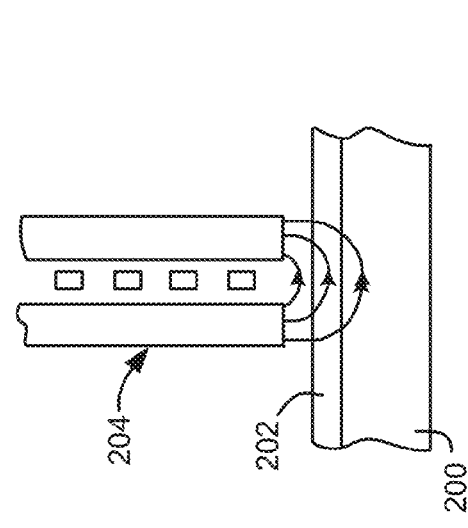

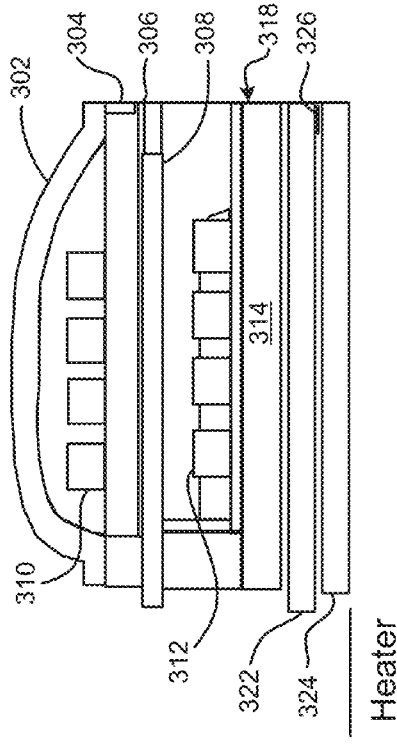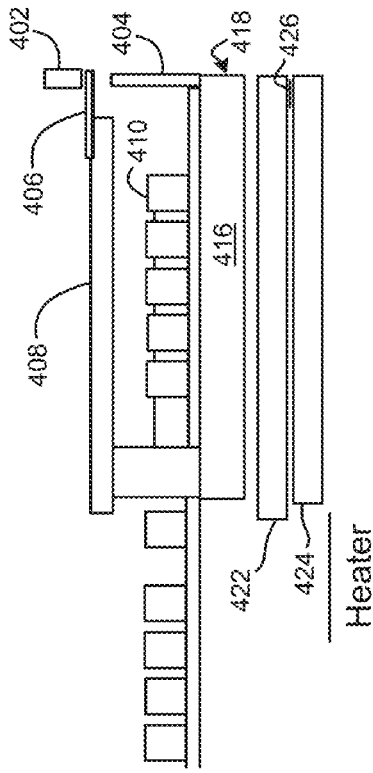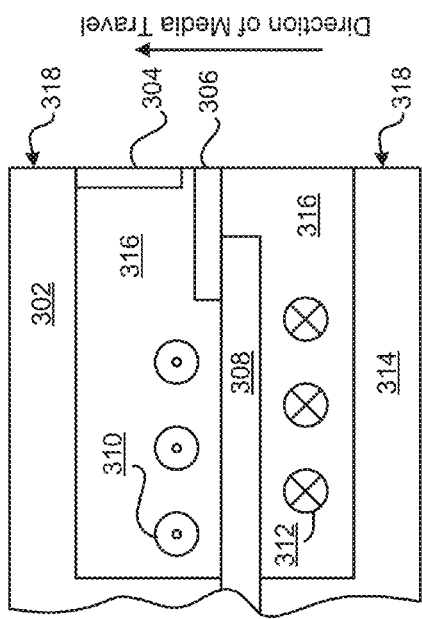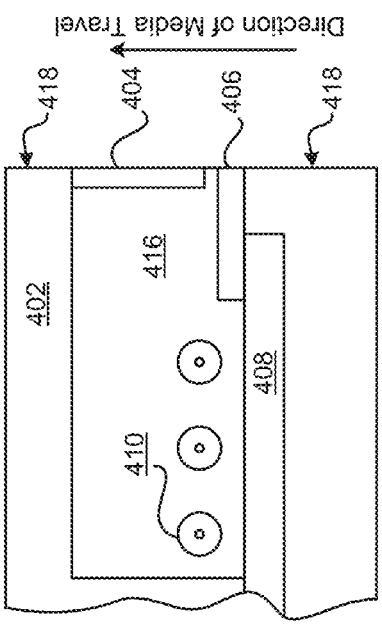

SLIDER WITH HIGH FREQUENCY VOLTAGE GROUND AND LOW FREQUENCY DC VOLTAGE ISOLATION

FIELD OF THE INVENTION

The present invention relates to magnetic data storage devices, and more particularly, this invention relates to a magnetic data storage device that has an AC grounded and DC isolated slider.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, it is desired that HDDs be able to store more information in their limited area and volume. A technical approach to this desire is to increase the capacity by increasing the recording density of the HDD. To achieve higher recording density, further miniaturization of recording bits is effective, which in turn typically requires the design of smaller and smaller components.

The further miniaturization of the various components, however, presents its own set of challenges and obstacles. As areal density increases the read/write transducers need to be placed closer to the media for acceptable performance. This reduced spacing places the slider at higher risk of relatively low life time due to lube accumulation and wear.

SUMMARY

In one embodiment, a slider includes a substrate, a magnetic head, and a coupling capacitor configured to AC couple an electronics ground of the slider to the substrate and DC decouple the electronics ground of the slider from the substrate.

In another embodiment, a method for forming a capacitor includes forming a substrate, forming a first conductive layer above the substrate, forming a gap layer above the first conductive layer, forming a dielectric layer above the gap layer and the first conductive layer, and forming a second conductive layer above the dielectric layer.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof. The problem of lube accumulation and reduced life time may be mitigated by removing electric fields from a head-to-disk gap by placing a potential of the magnetic head relative to the disk at a small negative value—just sufficient to overcome the differential work functions of the head/disk conductors. However, high frequency readback signal integrity requires connection of the slider and disk to the electronics ground. Therefore, a coupling capacitor has been developed that allows the DC voltage difference to be a non-zero value while the substrate is effectively grounded for frequencies above a reasonably low value.

In one general embodiment, a slider includes a substrate, a magnetic head, and a coupling capacitor configured to AC couple an electronics ground of the slider to the substrate and DC decouple the electronics ground of the slider from the substrate.

In another general embodiment, a method for forming a capacitor includes forming a substrate, forming a first conductive layer above the substrate, forming a gap layer above the first conductive layer, forming a dielectric layer above the gap layer and the first conductive layer, and forming a second conductive layer above the dielectric layer.

Figure 1:
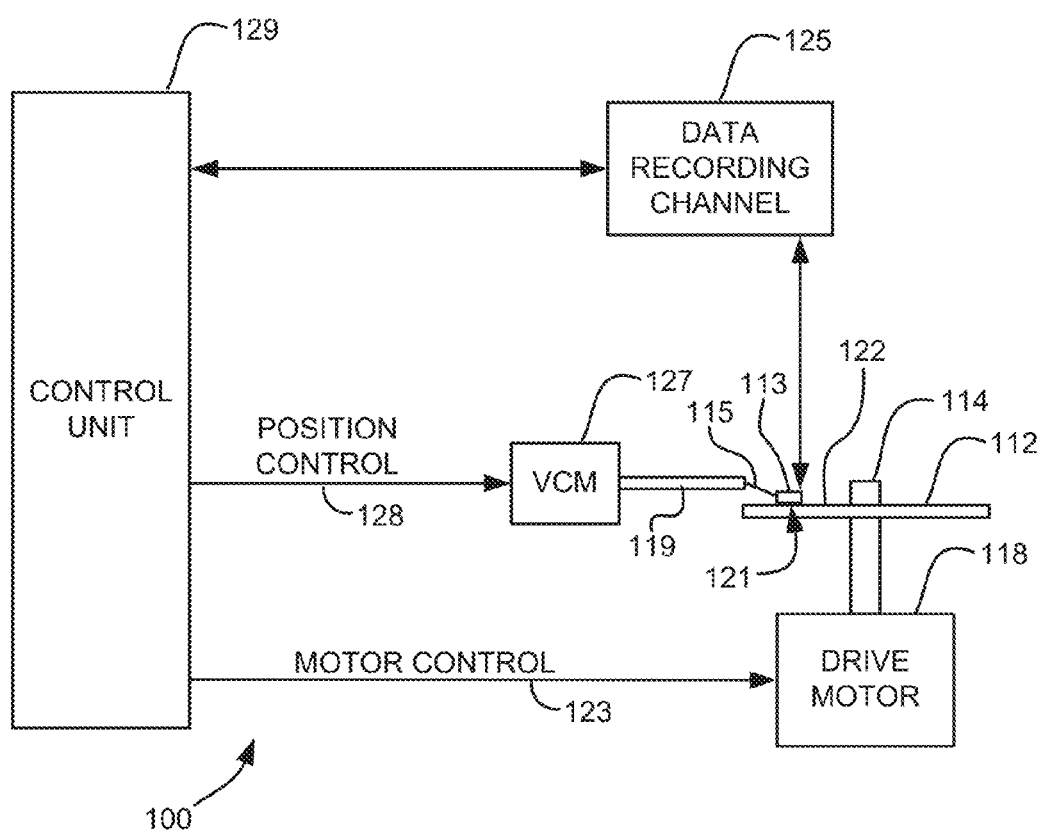
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic medium (e.g., magnetic disk) 112 is supported on a spindle 114 and rotated by a drive mechanism, which may include a disk drive motor 118. The magnetic recording on each disk is typically in the form of an annular pattern of concentric data tracks (not shown) on the disk 112. Thus, the disk drive motor 118 preferably passes the magnetic disk 112 over the magnetic read/write portions 121, described immediately below.

At least one slider 113 is positioned near the disk 112, each slider 113 supporting one or more magnetic read/write portions 121, e.g., of a magnetic head according to any of the approaches described and/or suggested herein. As the disk rotates, slider 113 is moved radially in and out over disk surface 122 so that portions 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. In a preferred approach, the control unit 129 is electrically coupled (e.g., via wire, cable, line, etc.) to the one or more magnetic read/write portions 121, for controlling operation thereof. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write portions 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write portion includes a coil layer embedded in one or more insulation layers (insulation stack), the insulation stack being located between first and second pole piece layers. A gap is formed between the first and second pole piece layers of the write portion by a gap layer at or near a media facing side of the head (sometimes referred to as an ABS in a disk drive). The pole piece layers may be connected at a back gap. Currents are conducted through the coil layer, which produce magnetic fields in the pole pieces. The magnetic fields fringe across the gap at the media facing side for the purpose of writing bits of magnetic field information in tracks on moving media, such as in circular tracks on a rotating magnetic disk.

The second pole piece layer has a pole tip portion which extends from the media facing side to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft under layer 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the media facing side 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the media facing side 318. The media facing side 318 is indicated across the right side of the structure.

Perpendicular writing is achieved by forcing flux through the stitch pole 308 into the main pole 306 and then to the surface of the disk positioned towards the media facing side 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the media facing side 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the media facing side 418). The media facing side 418 is indicated across the right side of the structure. The trailing shield 404 may be in contact with the main pole 406 in some embodiments.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown away from the media facing side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Except as otherwise described herein, the various components of the structures of FIGS. 3A-4B may be of conventional materials and design, as would be understood by one skilled in the art.

Figure 5A:
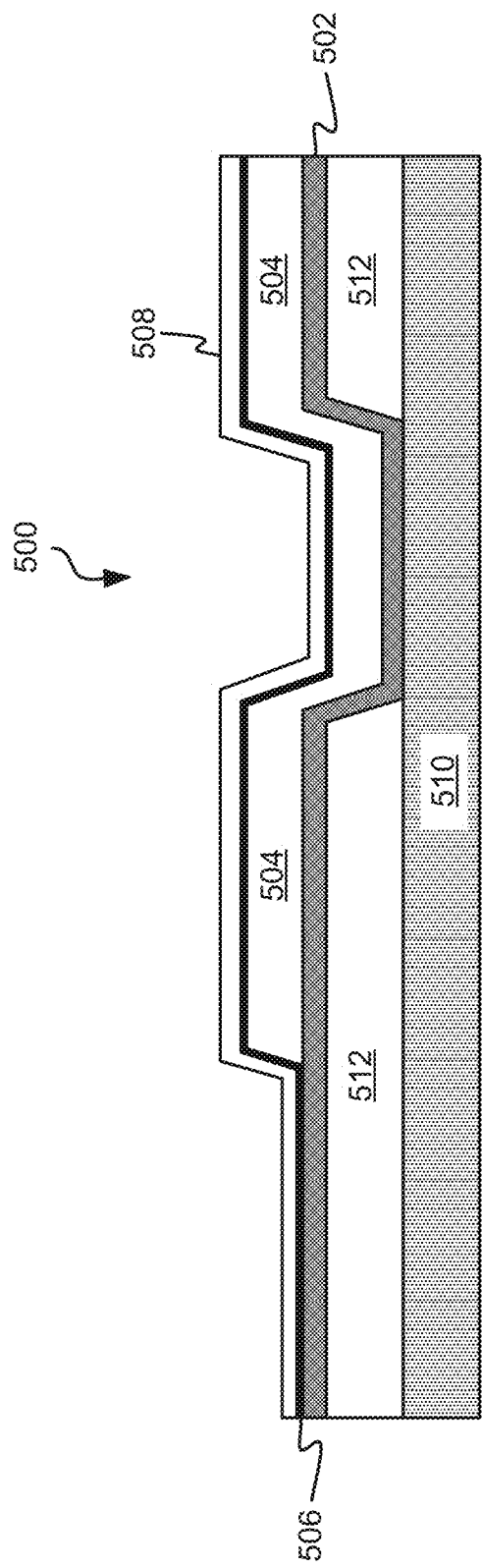
FIG. 5A shows a side view of a coupling capacitor, according to one embodiment.

Now referring to FIG. 5A, a side view of a coupling capacitor 500 is shown according to one embodiment. The coupling capacitor 500 may be configured to AC couple an electronics ground of a slider to a substrate, and to DC decouple the electronics ground of the slider from the substrate. In this way, the problem of lube accumulation and wear on the slider may be mitigated by removing the electric field from the head-to-disk gap by placing the head potential relative to the disk at a small negative value (just sufficient to overcome the differential work functions of the head/disk conductors).

Figure 5B:
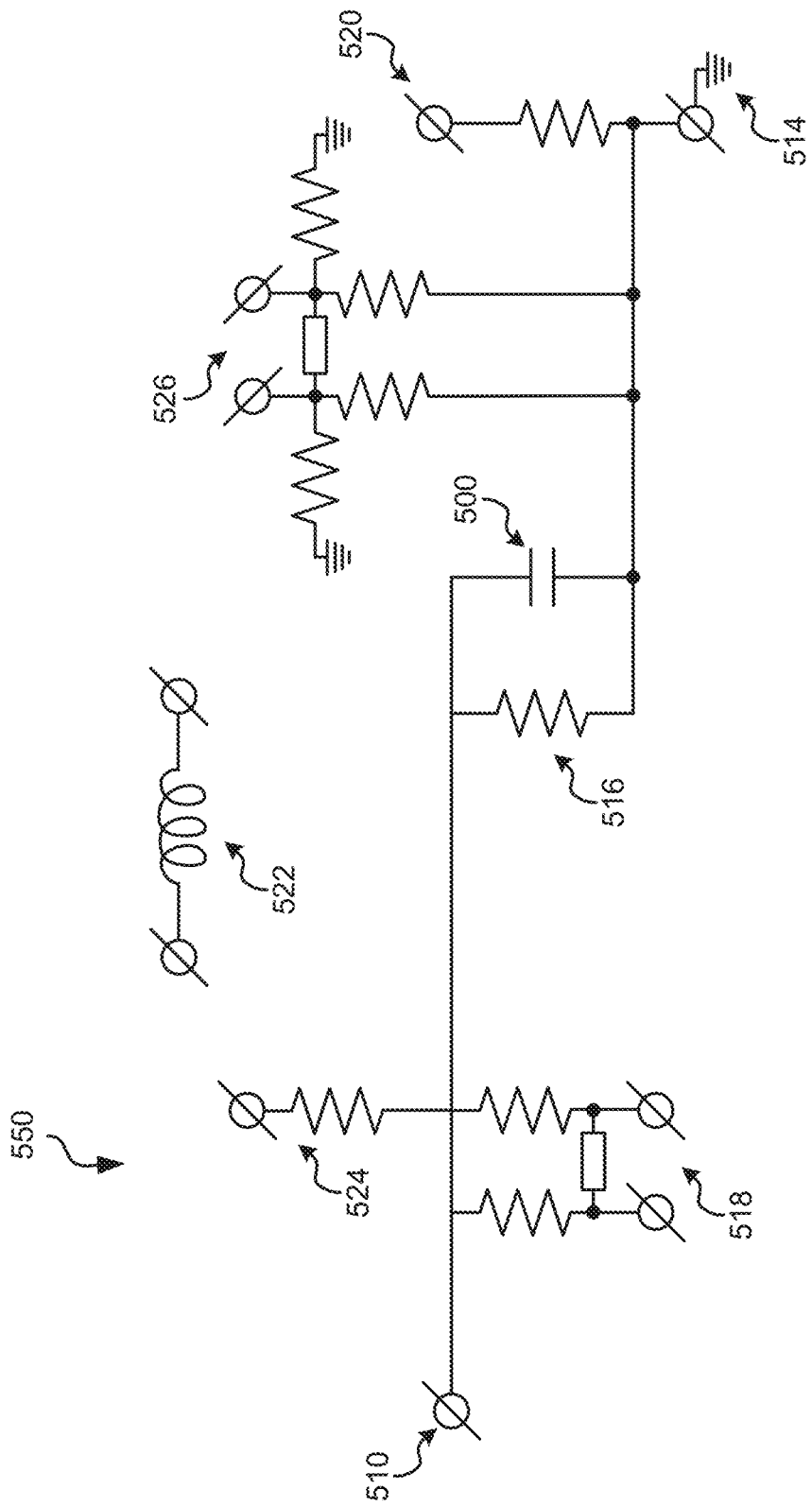
FIG. 5B shows a portion of a slider circuit according to one embodiment.

The slider may comprise the substrate 510, a magnetic head (such as reader and/or writer), and the coupling capacitor, along with any other components known in the art that may be included in the slider, according to various embodiments. A more detailed view of a slider circuit is shown in FIG. 5B according to one embodiment.

Referring again to FIG. 5A, the coupling capacitor 500 includes a first conductive layer 502 (which forms the lower plate of the capacitor), a gap layer 504, a dielectric layer 506, and a second conductive layer 508 (which forms the upper plate of the capacitor). The first conductive layer 502 may be formed above a substrate 510 which may comprise any suitable material known in the art, and may be a substrate which is used for other portions of the slider, in one embodiment.

Above the substrate 510, an undercoat layer 512 may be formed in one approach. The undercoat layer 512 may comprise any suitable material known in the art. The first conductive layer 502 and the second conductive layer 508 may comprise any suitable conductive material known in the art, such as Cu, Ag, Au, etc., in various approaches. The gap layer 504 may comprise any suitable material known in the art, such as alumina and other materials known in the art that are similar to alumina. Furthermore, the gap layer 504 may be formed full film in order to completely cover the area of the capacitor from a top-down view.

More layers may be formed and/or more operations may be performed on the structure shown in FIG. 5A as would be understood by one of skill in the art, such as etching of layer(s), chemical mechanical polishing (CMP) of layer(s), planarizing layer(s), masking of layer(s), forming additional layers such as seed layer(s), shield layer(s), alumina layer(s), copper layer(s), sensor layer(s), top plate layer(s), pad layer(s), etc.

In one embodiment, the dielectric layer 506 may comprise alumina ($Al_2O_3$). The alumina may be formed using any process known in the art, such as sputtering, chemical vapor deposition (CVD), ion beam deposition (IBD), atomic layer deposition (ALD), or any other deposition technique known in the art. In one embodiment, the alumina may be formed via sputtering, as is understood in the art. In accordance with another preferred embodiment, the alumina may be formed via atomic layer deposition (ALD) in order to provide a conformal layer having a substantially uniform thickness throughout the layer with no variations, contaminants, and/or weaknesses. In one embodiment, the dielectric layer 506 may be formed in a multi-layer structure, such as one having physical characteristic of having been formed via ALD with each layer having substantially the same thickness (one molecule of alumina).

The first conductive layer 502 may be formed to a thickness of between about 75 nm and about 300 nm, such as about 150 nm, according to one embodiment. The gap layer 504 may be formed to a thickness of between about 250 nm and about 1000 nm, such as about 500 nm according to one embodiment.

In one embodiment, the first conductive layer may be connected to the substrate 510 using at least three connection points. In preferred embodiments, four or more connection points may be used.

The dielectric layer 506 may be formed to a thickness from about 5 nm to about 100 nm, such as in a range from about 10 nm to about 60 nm. In various embodiments, the thickness of the dielectric layer 506 may be about 20 nm, 25 nm, 28 nm, 30 nm, etc. Of course, the thicker the dielectric layer 506 is, the lower the capacitance of the coupling capacitor 500 is, and the larger area that the capacitor will require on the slider in order to provide a set capacitance or predetermined capacitance.

The second conductive layer 508 may be formed to a thickness of between about 75 nm and about 300 nm, such as about 150 nm, according to one embodiment.

The gap layer 504 may be etched after being formed full film, in order to establish the area of the coupling capacitor 500. The etching may be carried out according to any technique or method known in the art, such as masking and etching. In one embodiment, the area of the coupling capacitor 500 (which taken in conjunction with the thickness of the dielectric layer 506) may be selected in order to provide a capacitance of the coupling capacitor 500 of between about 20 pF and about 200 pF, such as about 25 pF, 50 pF, 100 pF, 150 pF, etc., according to various embodiments.

In order to investigate the viability of different materials in the dielectric layer 506 of the coupling capacitor 500, experiments were conducted on formed sliders using different materials. Alumina is able to be made with a relative permittivity of up to about 9 (as opposed to $SiO_2$ which has a relative permittivity of about 2). A large capacitor may be formed on the slider due to this higher relative permittivity, which led to alumina being investigated as a possible material to be used in the dielectric layer 506.

The formation technique used to form the alumina in the dielectric layer 506 had an effect on the performance of the coupling capacitor 500 for protection from damage to the slider. This was determined based on experiments conducted on sliders formed with alumina as the dielectric layer 506 material.

Over 300 wafers with alumina deposited via ALD for the dielectric layer 506 were manufactured. The element yield for these wafers was about 99.8%, well above 99%. In contrast, in sliders which used sputtered alumina for the dielectric layer 506 resulted in about 95% element yield, which is acceptable, but less than the yield experienced for ALD alumina.

Furthermore, ALD alumina nay be formed purer than sputtered alumina and may be deposited conformally, which provides for a more uniform thickness in the dielectric layer 506, and reduces the chance of weak points in the layer which may lead to shorting.

In addition, the dielectric constant of ALD alumina is more controllable than the dielectric constant of sputtered alumina, and the dielectric breakdown of ALD alumina is more intrinsic than for sputtered alumina. Edges, surface defects, and contaminates are also more fully covered because the film growth of ALD alumina is uniform in all directions. This results in the capacitance of ALD alumina being more controllable.

In order to form the ALD alumina dielectric layer 506, the thickness may be determined by counting cycles instead of depending on a sputtering time and sputtering rate, resulting in much more precise control of the thickness of the dielectric layer 506. In a dielectric layer 506 formed from ALD alumina, the thickness will not vary across the layer, as opposed to an effect that may be observed with a dielectric layer 506 formed from sputtered alumina.

However, the ALD process is more intensive than a sputtering process, but the rewards derived therefrom seem to outweigh the drawbacks.

Now referring to FIG. 5B, a portion of a slider circuit 550 is shown according to one embodiment. As shown, the slider circuit 550 may include the coupling capacitor 500 positioned between the electronics ground 514 of the slider and the substrate 510 of the slider. The slider, and thus the slider circuit 550, may also include at least one common mode component coupled to the coupling capacitor, such as an embedded contact sensor (ECS) 518, a heater element (not shown), a thermal fly-height control (TFC) element 520, etc.

In various embodiments, the slider, and thus the slider circuit 550, may also include a writer core 524, a write coil 522 configured to write data to a magnetic medium when energized, and/or a tunneling magnetoresistive (TMR) reader element 526.

In another embodiment, the slider, and thus the slider circuit 550, may also include a bleed resistor 516 positioned in parallel with the coupling capacitor 500 in the slider circuit 550 between the substrate 510 and the electronics ground 514 of the slider. The bleed resistor 516 may have any suitable resistance, depending on the design of the slider circuit 550. In one embodiment, the bleed resistor 516 may have a resistance in a range from about 50 kΩ to about 300 kΩ.

A magnetic head may be included in the slider, as known in the art, while the coupling capacitor is configured to prevent damage caused by ESD. Furthermore, a magnetic data storage system may comprise at least one slider as described above, a magnetic medium, a drive mechanism for passing the magnetic medium over the at least one slider, and a controller electrically coupled to the at least one slider for controlling operation of the magnetic head therein.

In one embodiment, the controller may be configured to apply a negative bias to the at least one slider to reduce accumulation of contaminants on the at least one slider during use thereof. The negative bias may be in a range from about −0.05V to about −1.0V, according to various approaches. Conventional slider constructions which directly connect the substrate to the ground through a low resistance path are not capable of having such a negative bias applied, and therefore do not benefit from the reduction in accumulation of contaminants on the at least one slider during use thereof, nor of the ability to adjust fly-height based on the bias applied.

Figure 6:
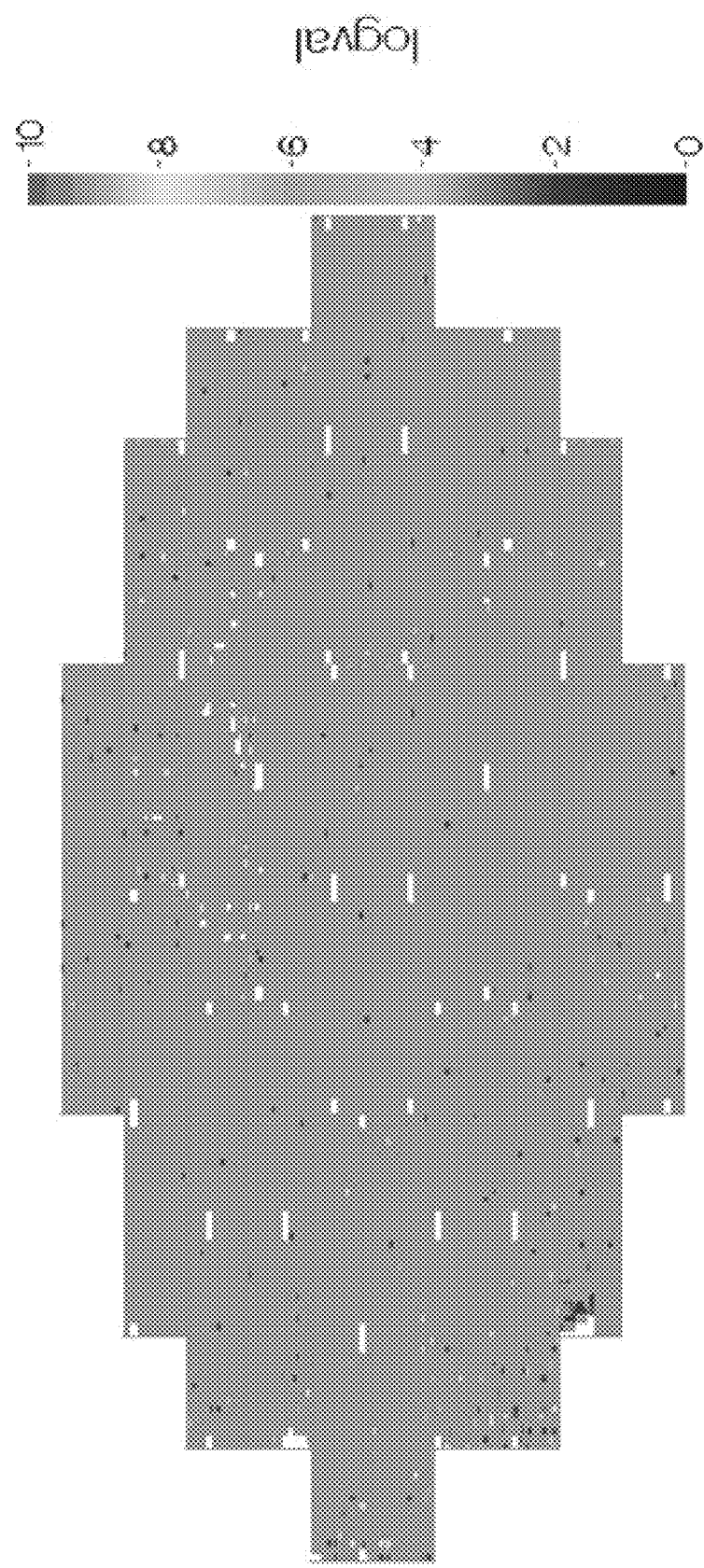
FIG. 6 shows yield loss from a 60 nm sputtered gap using alumina as the dielectric layer material.

Now referring to FIG. 6, a figure shows the yield loss from a 60 nm sputtered gap using alumina as the dielectric layer material (which correlates to a capacitance of about 25 pF). The figure shows a wafer having about 58,000 heads formed thereon, with white indicating heads that were not tested (for one of various reasons known in the art), black indicating heads that failed testing, and grey indicating heads that passed testing. As can be seen, for the 60 nm sputtered gap using alumina as the dielectric layer material, a yield of about 95% was achieved.

Figure 7:
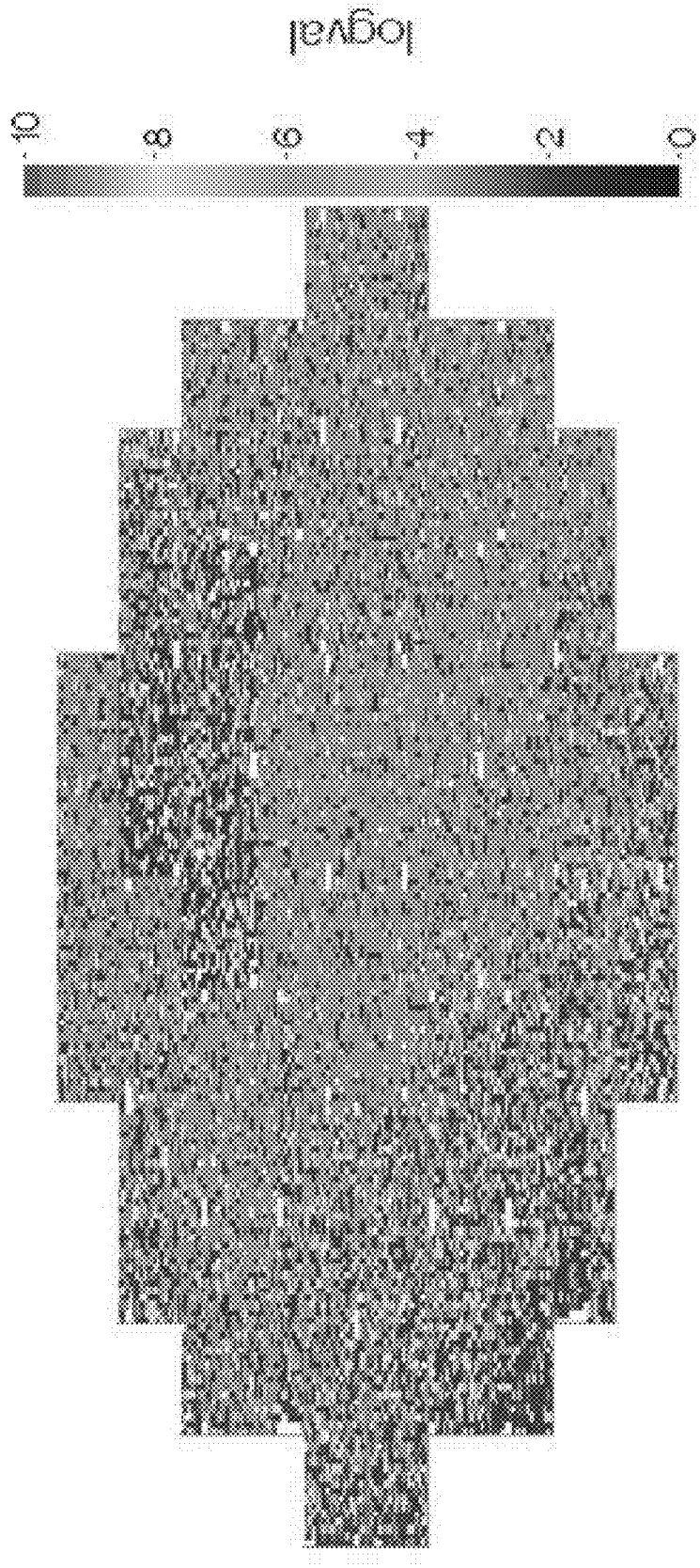
FIG. 7 shows yield loss from a 30 nm sputtered gap using alumina as the dielectric layer material.

With reference to FIG. 7, a figure shows the yield loss from a 30 nm sputtered gap using alumina as the dielectric layer material (which correlates to a capacitance of about 50 pF). The colors indicate the same testing results as in FIG. 6. As can be seen in FIG. 7, for the 30 nm sputtered gap using alumina as the dielectric layer material, a yield of about 50% was achieved, which is not acceptable for mass manufacturing of magnetic heads.

Figure 8:
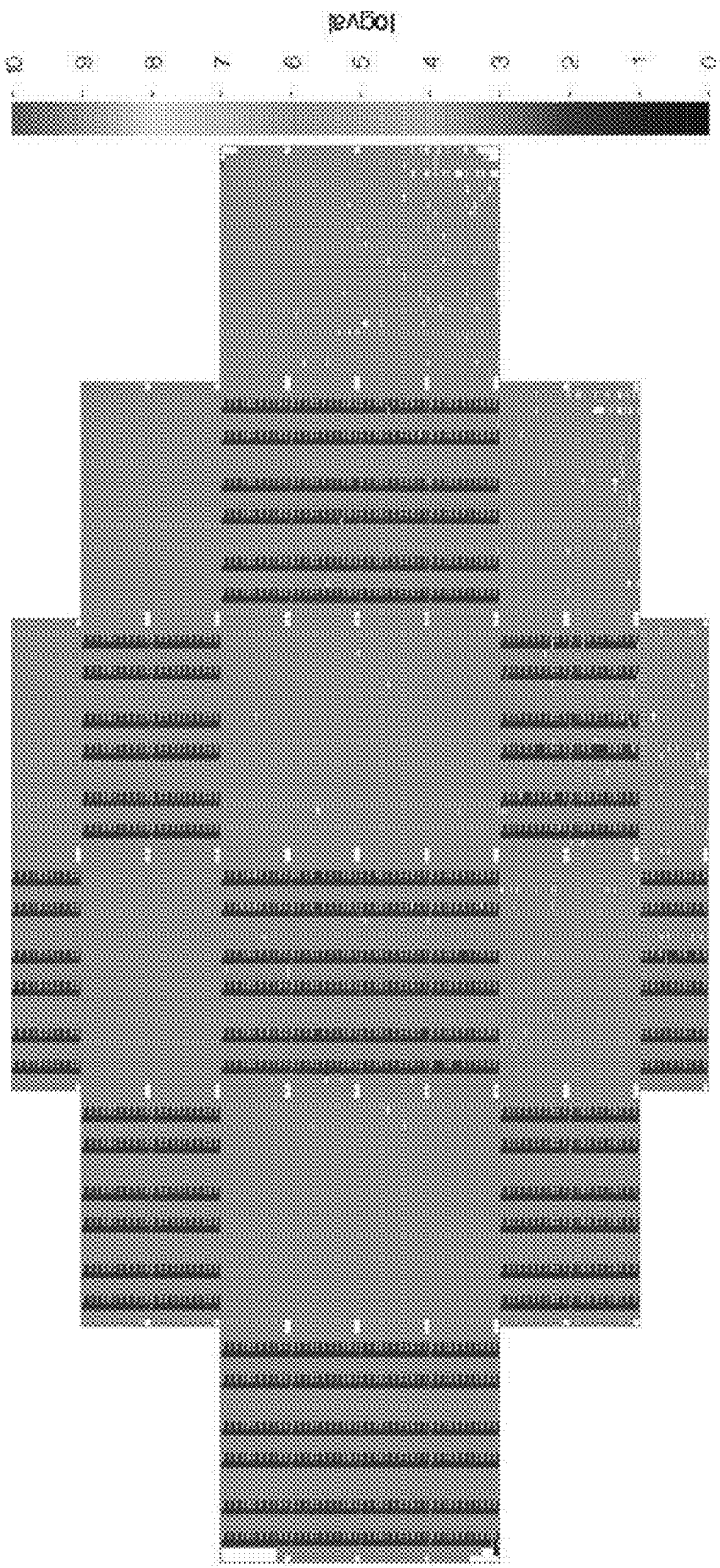
FIG. 8 shows yield loss from a 30 nm gap using alumina formed via atomic layer deposition (ALD) as the dielectric layer material.

Referring now to FIG. 8, the yield loss from a 30 nm gap using ALD alumina as the dielectric layer material (which correlates to a capacitance of about 50 pF) is shown. The colors indicate the same testing results as in FIG. 6. However, in the results shown in FIG. 7, there was some systematic testing errors which are not characteristic of heads failing, but rather of testing deficiencies which resulted in heads failing in a systematic way which is not predictive of actual head failure in use. For the 30 nm gap using ALD alumina as the dielectric layer material, a yield of greater than about 99% was achieved for the heads which were tested outside of the systematic failed heads in the obviously observable striped patterns across the wafer, which is exceptional for mass manufacturing of magnetic heads. This yield (actually about 99.8% yield) excluded pad check failed heads, as these are not indicative of head failure, but instead of an inability to connect to the head to properly test. It is assumed that the heads which failed in the systematic pattern would achieve a similar yield as those which were tested outside of the systematic pattern.

Figure 9:
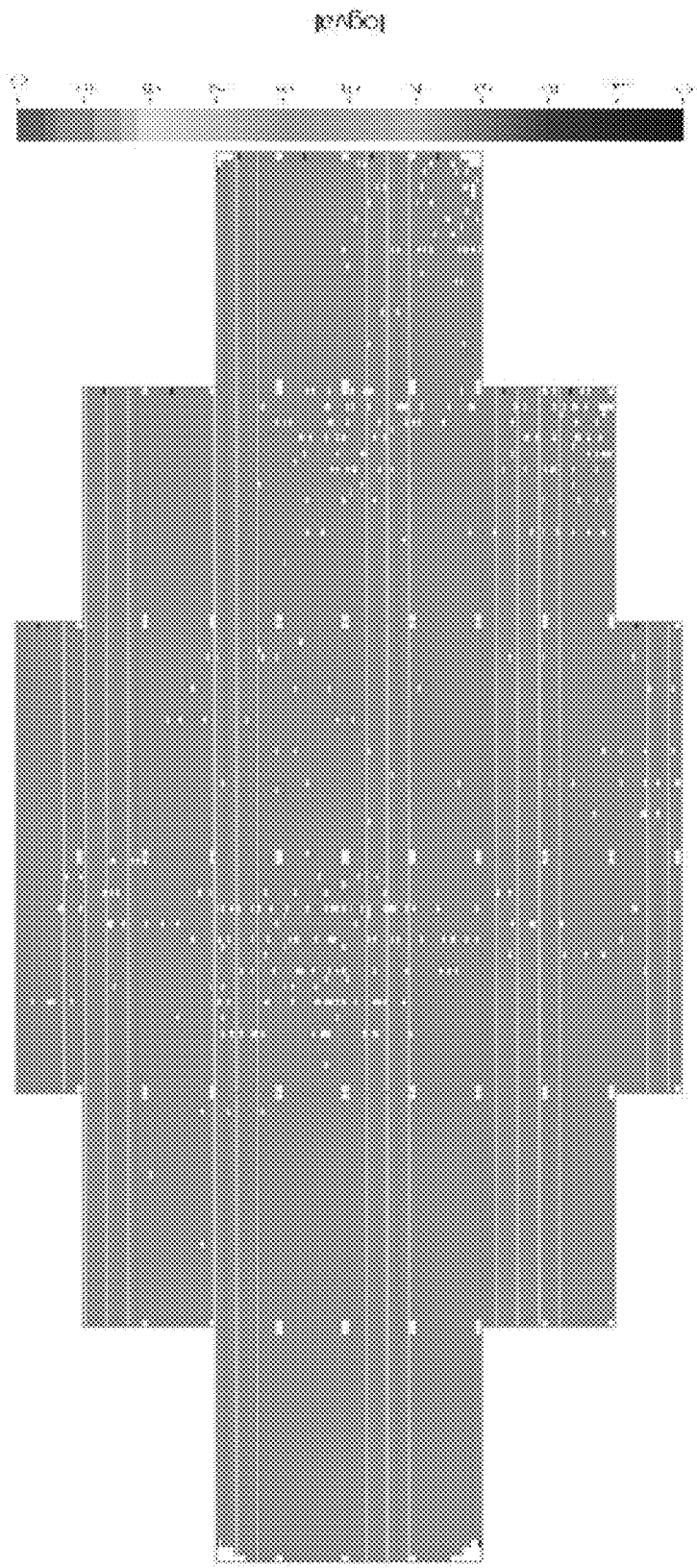
FIG. 9 shows yield loss from a 15 nm gap using ALD alumina as the dielectric layer material.

With reference to FIG. 9, the yield loss from a 15 nm gap using ALD alumina as the dielectric layer material (which correlates to a capacitance of about 100 pF) is shown. The colors indicate the same testing results as in FIG. 6. However, in the results shown in FIG. 9, there was some systematic incomplete testing in stripes across the wafer which are not characteristic of heads failing, but rather of testing deficiencies which is not predictive of actual head failure in use. For the 15 nm gap using ALD alumina as the dielectric layer material, a yield of greater than about 99% was achieved for the heads which were tested outside of the systematic fail incomplete testing across the wafer, which is exceptional for mass manufacturing of magnetic heads. This yield excluded pad check failed heads, as these are not indicative of head failure, but instead of an inability to connect to the head to properly test. It is assumed that the heads which were not able to be tested in the systematic pattern would achieve a similar yield as those which were tested outside of the systematic pattern.

The yield data in FIGS. 6-9 were taken immediately after completion of the coupling capacitor on the wafer. This data does not account for subsequent ESD damage which may be detected at a final manufacturing stage, due to handling, stray electrical fields, or other sources of ESD during manufacturing. As shown in FIGS. 6-9, 60 nm sputtered alumina is marginally acceptable, and could be used in magnetic heads to form the dielectric layer in the coupling capacitor. The 30 nm sputtered alumina is not acceptable for use in formation of the dielectric layer in the coupling capacitor. The 30 nm ALD alumina dielectric layer has an excellent yield, while the 15 nm ALD alumina dielectric layer also has excellent yield demonstrating that the process using ALD alumina as the dielectric layer in the coupling capacitor has excellent margin.

Figure 10A:
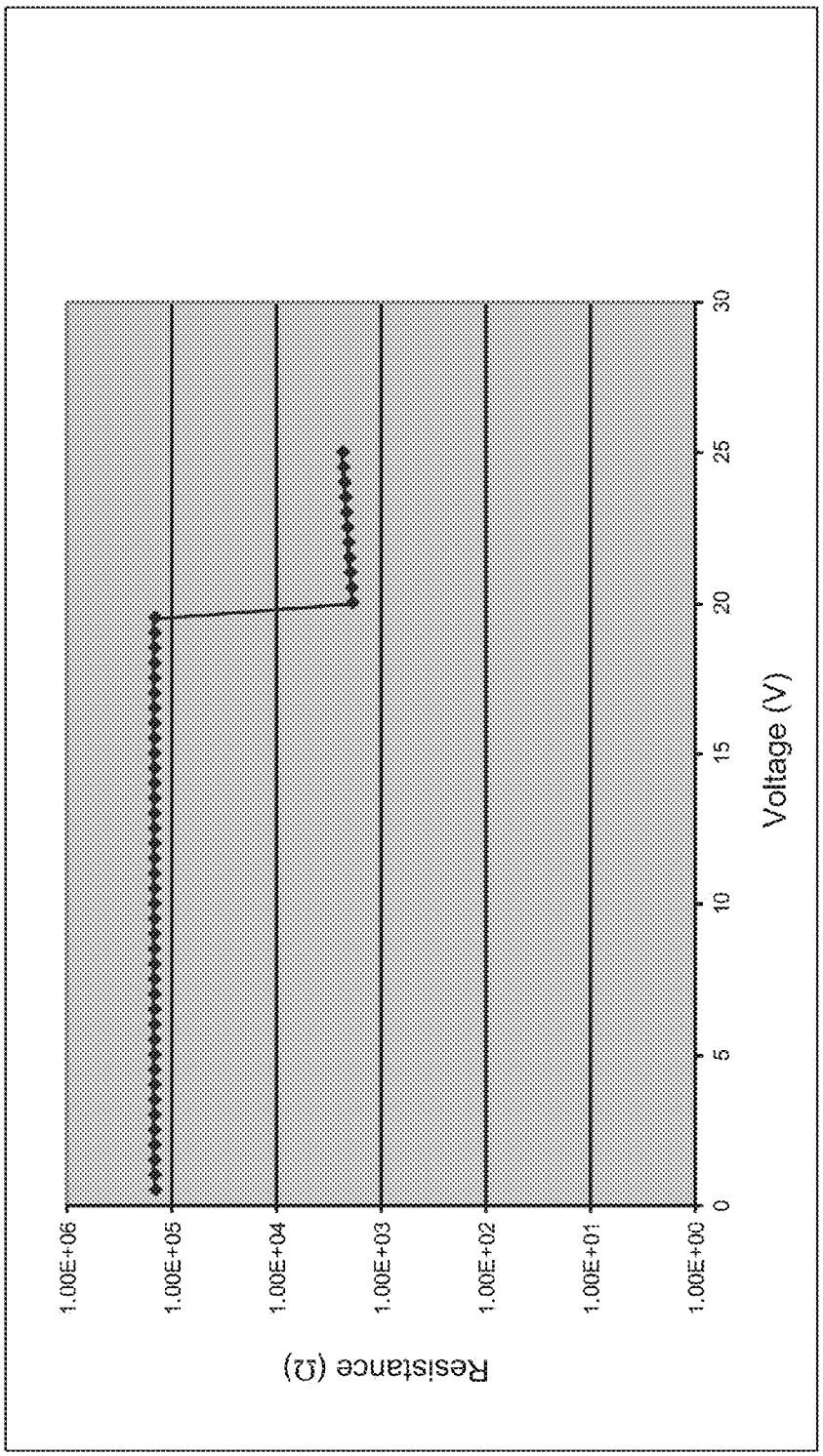
FIG. 10A shows breakdown voltage of a magnetic head slider according to experimental results.
Figure 10B:
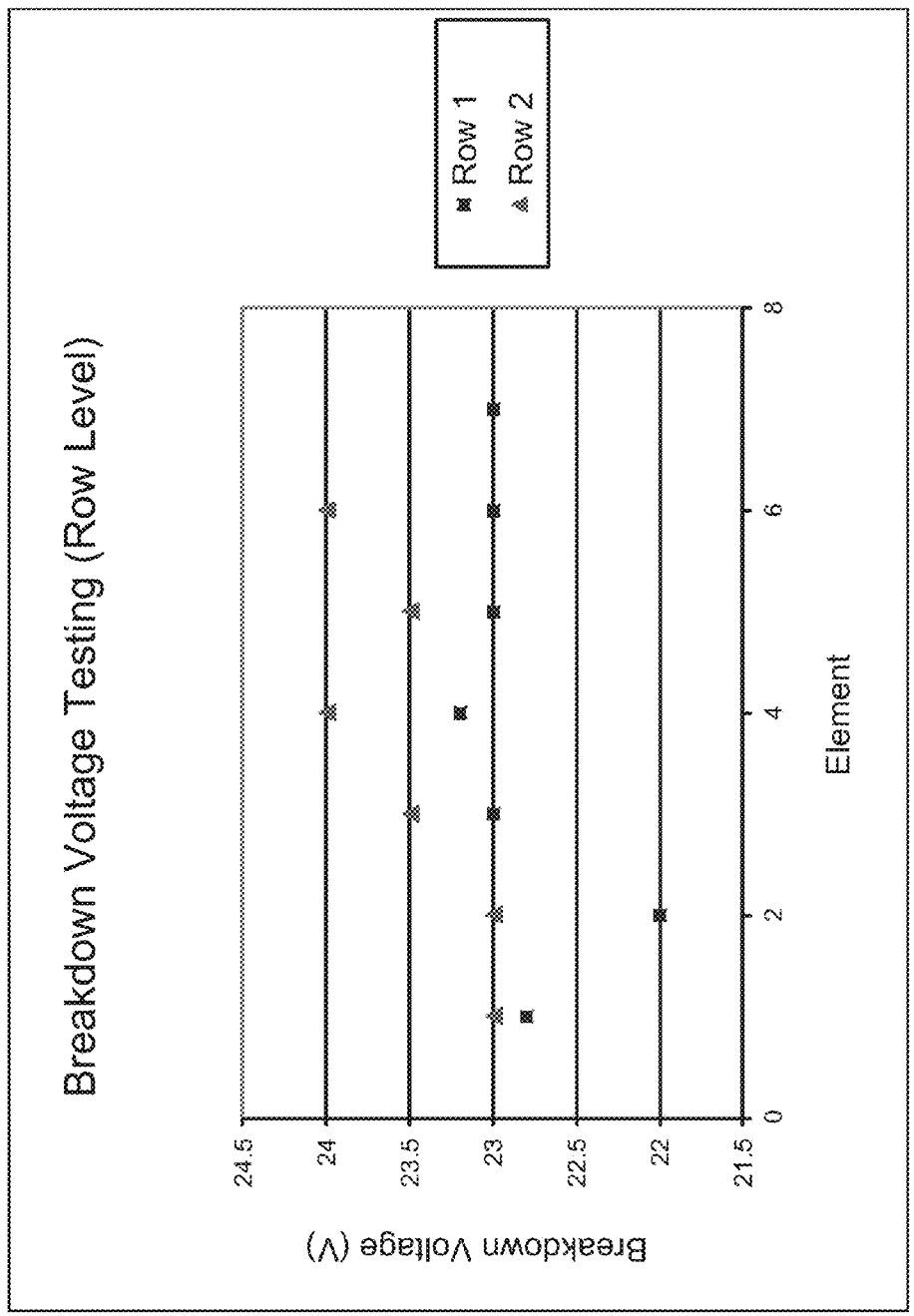
FIG. 10B shows results from breakdown voltage testing at the row level of magnetic head sliders according to experiments.

Now referring to FIGS. 10A-10B, the breakdown voltage of coupling capacitors using ALD alumina is shown in one exemplary embodiment. In FIG. 10A, the breakdown voltage of an exemplary coupling capacitor is shown. As can be seen, the breakdown voltage is similar to that of bulk alumina, about 1 V/nm. Also, as shown in FIG. 10B, the breakdown testing at the row level for two exemplary rows of coupling capacitors show that the breakdown voltage (about 23 V) is consistent across the row of the wafer, thereby indicating that each coupling capacitor has a consistent dielectric layer formed therein via ALD alumina.

During testing of the various structures manufactured with the ALD alumina for the dielectric layer in the coupling capacitor, an issue was discovered which caused some portions of the sliders to delaminate and come apart, which resulted in inoperability of those units which were affected by the delamination. It was discovered that ALD alumina does not adhere well to sputtered alumina. However, ALD alumina does adhere well to every metal that was tested. Since sputtered alumina is used throughout formation of magnetic head sliders, and particularly in previous and subsequent processing steps before and after the formation of the coupling capacitor, this presents a challenge to using both ALD alumina and sputtered alumina (which is easier to form than ALD alumina) in the formation of magnetic head sliders.

In order to overcome this difficulty, the coupling capacitor may be masked with a photoresist or some other suitable material, and then the ALD alumina may be milled through, etched, etc., until it is removed from all surfaces except for the coupling capacitor. Then, after the photoresist is removed from above the coupling capacitor(s) on a magnetic head slider, no exposed ALD alumina will remain, thereby alleviating any concerns of delamination occurring between sputtered and ALD alumina. The additional process complexity is negligible since one or more vias for electrical connections are patterned using a similar process already in the manufacturing of conventional magnetic head sliders. Essentially, this adds a non-critical mill to the process, which will have a negligible effect on the efficiency of the manufacturing process.

Figure 11:
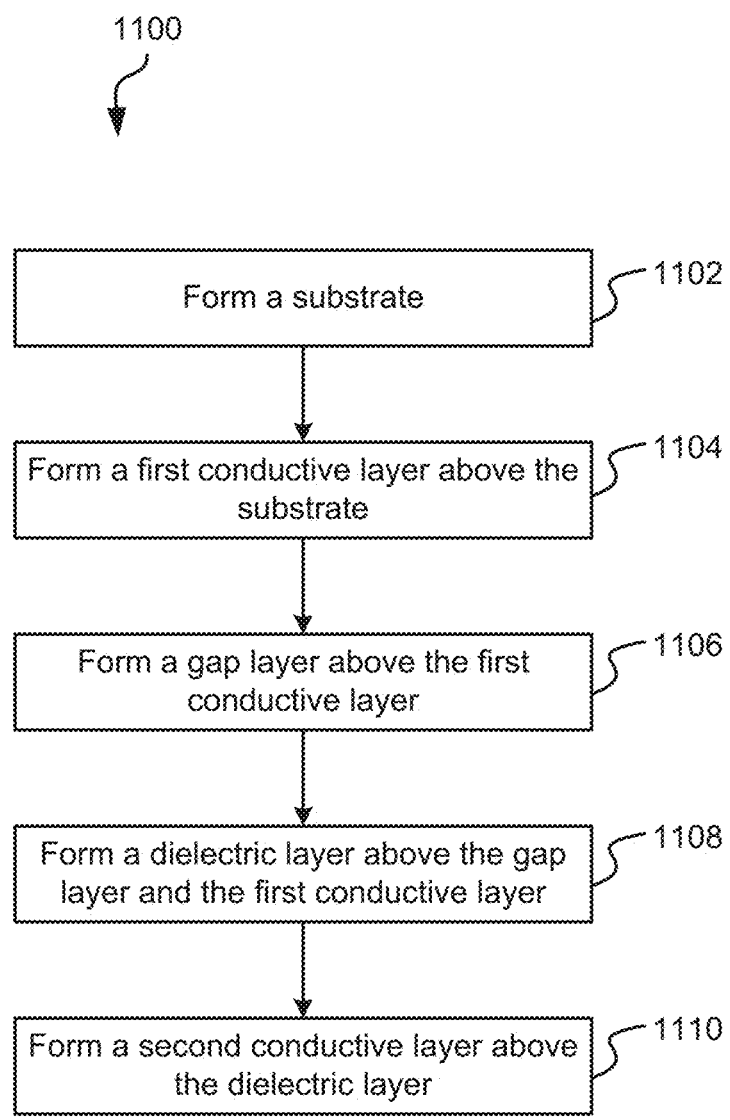
FIG. 11 shows a flowchart of a method according to one embodiment.

FIG. 11 shows a method 1100 for forming a coupling capacitor, such as for use in a magnetic head, in accordance with one embodiment. As an option, the present method 1100 may be implemented to construct structures such as those shown in FIGS. 1-10B. Of course, however, this method 1100 and others presented herein may be used to form magnetic structures for a wide variety of devices and/or purposes which may or may not be related to magnetic recording. Further, the methods presented herein may be carried out in any desired environment. It should also be noted that any aforementioned features may be used in any of the embodiments described in accordance with the various methods.

In operation 1102, a substrate is formed, using any suitable material and technique known in the art.

In operation 1104, a first conductive layer is formed above the substrate. In one embodiment, the first conductive layer may comprise Cu, Au, Ag, and/or some other suitable conductive material known in the art. The first conductive layer may be configured to act as a bottom plate for a coupling capacitor in a magnetic head slider, in one embodiment.

The shape of the first conductive layer may be effected by an undercoat that is formed between the substrate and the first conductive layer, the undercoat possibly comprising one or more indentations, depressions, holes, etc., to form a variation in the height of the first conductive layer.

In one embodiment, at least three connections may be formed between the substrate and the first conductive layer, and in a preferred embodiment, four or more connections may be formed therebetween.

In operation 1106, a gap layer is formed above the first conductive layer. The gap layer may be formed full film, or may be formed above only a portion of the first conductive layer where separation between the first conductive layer and a second conductive layer is desired, such that the gap layer is not positioned above all of the first conductive layer. The gap layer may comprise any suitable material known in the art, such as alumina and/or some other suitable dielectric material known in the art.

When the gap layer is formed full film and/or above a portion of the first conductive layer that is not desired to have additional separation from the second conductive layer, the method 1100 may further include etching, milling, or otherwise removing one or more portions of the gap layer to establish an area of the coupling capacitor.

In operation 1108, a dielectric layer is formed above the gap layer and the first conductive layer. The dielectric layer may be formed full film, or may be deposited in areas where it is desired to be placed in order to provide spacing for the capacitor.

In various embodiments, the dielectric layer may comprise alumina and may have a thickness in a formation direction (a direction in which thickness increases as more material is deposited) of from about 5 nm to about 100 nm, such as a range from about 10 nm to about 60 nm, such as about 15 nm, 20 nm, 25 nm, 28 nm, 30 nm, etc.

In various embodiments, the alumina may be formed via sputtering, IBD, CVD, ALD, or any other technique known in the art. The physical characteristics of being formed via sputtering may include a single, continuous layer of alumina without any differentiation between various layers therein, shadow effects near contaminates and/or physical objects near or on the surface on which the sputtered alumina is formed, edge effects where the alumina layer is thinner near edges of the layer, and other known physical characteristics of sputtering known in the art.

In a preferred embodiment, the alumina may be formed via ALD. The physical characteristics of being formed via ALD may include definition of a plurality of layers, each layer being about one atom thick, conformal layer thickness across the entire cross-section of the alumina layer, substantially no impurities or contaminates being embedded within the alumina layer, no surface imperfections of the alumina layer, constant thickness across an entirety of the ALD alumina layer, and other known physical characteristics of ALD known in the art.

In operation 1110, a second conductive layer is formed above the dielectric layer. In one embodiment, the second conductive layer may comprise Cu, Au, Ag, and/or some other suitable conductive material known in the art. The second conductive layer may be configured to act as a top plate for the coupling capacitor in a magnetic head slider, in one embodiment. The shape of the second conductive layer may be effected by an undercoat that is formed between the substrate and the first conductive layer, the undercoat possibly comprising one or more indentations, depressions, holes, etc., to form a variation in the height of the first conductive layer, which effects the shape of layers formed thereon.

In one embodiment, the method 1100 may further include AC coupling an electronics ground of a slider to the substrate and DC decoupling the electronics ground of the slider from the substrate using the capacitor to prevent damage caused by ESD and/or other sources of electrostatic or electrical damage normally associated with magnetic head slider manufacturing known in the art.

In accordance with one embodiment, the method 1100 may further include forming at least one common mode component coupled to the capacitor, such as a TFC element, ECS, etc.

In another embodiment, the method 1100 may include masking areas of the dielectric layer not positioned above the first conductive layer with a mask, this mask may be used to cover all portions of the dielectric layer which will be included in the coupling capacitor, while leaving exposed all areas of the dielectric layer which will not be used in the coupling capacitor. The method 1100 then may further include milling away, etching, or otherwise removing exposed areas of the dielectric layer not covered by the mask, and removing the mask using any technique known in the art. In this way, any alumina which is deposited, particularly using ALD, which is left on other parts of the magnetic head slider will not cause adherence issues between it and subsequent deposition of alumina via sputtering. This will nullify any issues of delamination caused by the non-adherence of sputtered alumina on ALD alumina discussed previously.

In yet another embodiment, the method 1100 may be used to form an apparatus, the apparatus comprising a substrate, a first conductive layer positioned above the substrate, a gap layer positioned above the first conductive layer, a dielectric layer positioned above the gap layer and the first conductive layer, the dielectric layer comprising alumina, and a second conductive layer positioned above the dielectric layer.

According to another embodiment, method 1100 may include applying a negative bias to the at least one slider to reduce accumulation of contaminants on the at least one slider during use thereof. The negative bias may be in a range from about −0.05V to about −1.0V, such as about −0.3V, according to various approaches.

Figure 12:
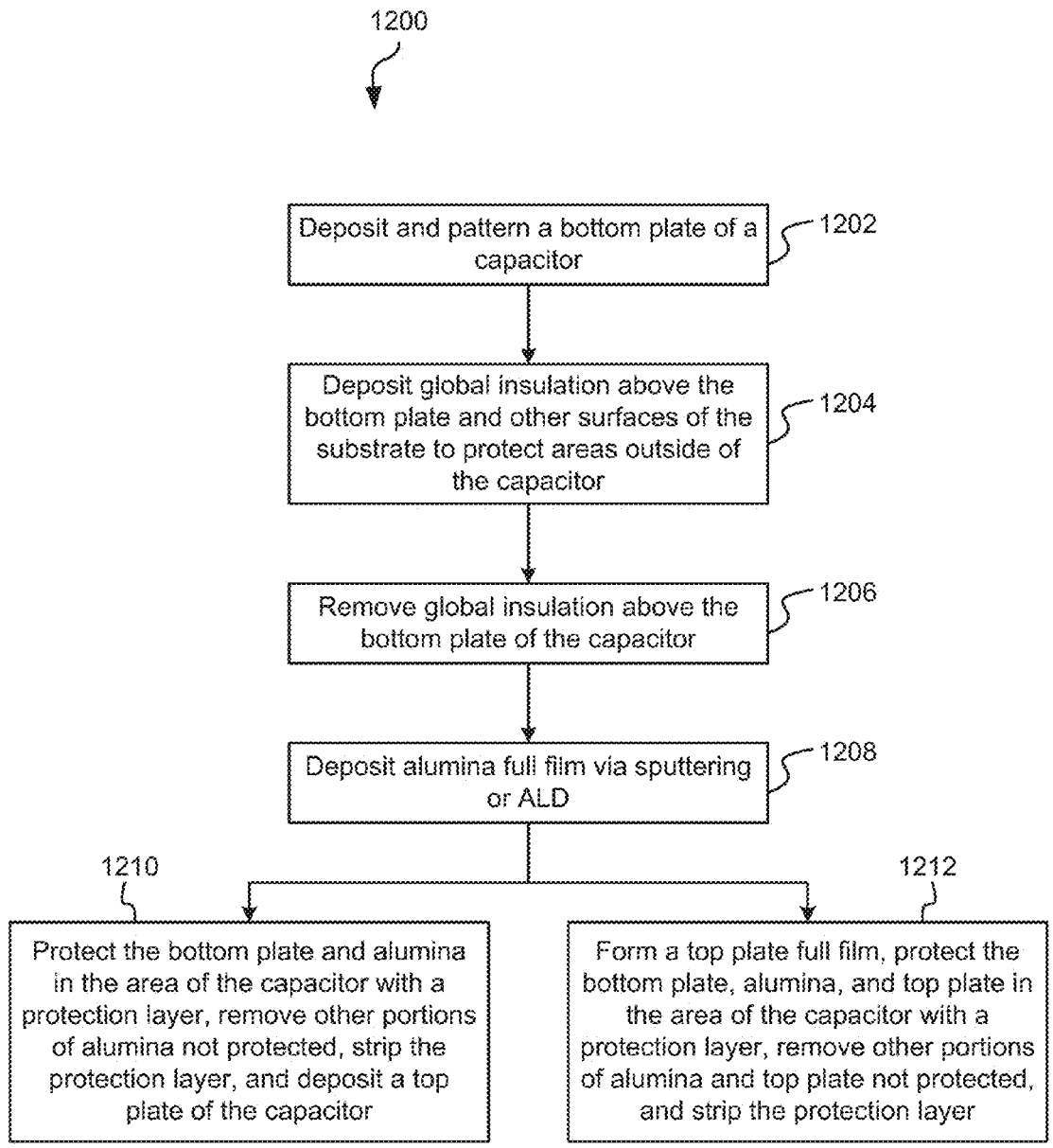
FIG. 12 shows a flowchart of a method according to one embodiment.

Now referring to FIG. 12, in one embodiment, a method 1200 may be used to form a magnetic head slider in one embodiment. As an option, the present method 1200 may be implemented to construct structures such as those shown in FIGS. 1-10B. Of course, however, this method 1200 and others presented herein may be used to form magnetic structures for a wide variety of devices and/or purposes which may or may not be related to magnetic recording. Further, the methods presented herein may be carried out in any desired environment. It should also be noted that any aforementioned features may be used in any of the embodiments described in accordance with the various methods.

In operation 1202, a lower or bottom plate of a coupling capacitor is deposited. The bottom plate is then patterned using any method known in the art to form a structure of a desired shape, thickness, etc., in order to function as a bottom plate of a capacitor, the bottom plate, in one embodiment, may comprise Cu or some other suitable material known in the art.

In operation 1204, global insulation is deposited above the bottom plate and other surfaces of the substrate to protect areas outside of the capacitor. Any suitable insulating material known in the art may be used, along with any known deposition technique.

In operation 1206, the global insulation above the bottom plate of the capacitor is removed using any technique known in the art.

In operation 1208, alumina is deposited full film, such as via ALD or sputtering, as described herein according to various embodiments.

In operation 1210, the bottom plate and alumina in the area of the capacitor are protected with a protection layer, such as with a photoresist stencil, the other portions of alumina not protected are removed, such as via milling, the photoresist is stripped, and an upper or top plate of the capacitor is deposited, using any technique known in the art.

In alternate operation 1212, an upper or top plate is formed full film, the bottom plate, alumina, and top plate in the area of the capacitor are protected with a protection layer, such as with a photoresist stencil, the other portions of top plate and alumina not protected are removed, such as via milling, and the photoresist is stripped, using any technique known in the art.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A slider, comprising:
    a substrate;
    a magnetic head;
    a coupling capacitor configured to AC couple an electronics ground of the slider to the substrate and DC decouple the electronics ground of the slider from the substrate; and
    a bleed resistor positioned in parallel with the coupling capacitor in a circuit between the substrate and the electronics ground of the slider, the bleed resistor having a resistance in a range from about 50 kΩ to about 300 kΩ.

2. The slider as recited in claim 1, wherein the coupling capacitor comprises:
    a first conductive layer positioned above the substrate;
    a gap layer positioned above the first conductive layer;
    a dielectric layer positioned above the gap layer and the first conductive layer; and
    a second conductive layer positioned above the dielectric layer,
    wherein the first conductive layer and the second conductive layer each comprise Cu, Au, and/or Ag, and wherein the dielectric layer comprises alumina.

3. The slider as recited in claim 2, wherein the first conductive layer is configured to act as a bottom plate for the coupling capacitor, wherein the second conductive layer is configured to act as a top plate for the coupling capacitor, and wherein the dielectric layer has a thickness in a range from about 5 nm to about 100 nm.

4. The slider as recited in claim 3, further comprising an undercoat positioned between the substrate and the first conductive layer.

5. The slider as recited in claim 2, wherein the gap layer has physical characteristics of being formed full film, and wherein the gap layer is not positioned above all of the first conductive layer.

6. The slider as recited in claim 2, wherein the dielectric layer has physical characteristics of being formed via atomic layer deposition (ALD).

7. The slider as recited in claim 1, wherein the coupling capacitor is connected to the substrate using at least three connection points.

8. The slider as recited in claim 1, further comprising at least one common mode component coupled to the coupling capacitor.

9. The slider as recited in claim 2, wherein the dielectric layer is a conformal layer of alumina having a uniform thickness throughout.

10. A magnetic data storage system, comprising:
    at least one slider as recited in claim 1;
    a magnetic medium;
    a drive mechanism for passing the magnetic medium over the at least one slider; and
    a controller electrically coupled to the at least one slider for controlling operation of the magnetic head therein.

11. The magnetic data storage system as recited in claim 10, wherein the controller is configured to apply a negative bias to the at least one slider to reduce accumulation of contaminants on the at least one slider during use thereof.

12. A slider, comprising:
    a substrate;
    a magnetic head; and
    a coupling capacitor configured to AC couple an electronics ground of the slider to the substrate and DC decouple the electronics ground of the slider from the substrate,
    wherein the coupling capacitor comprises:
        a first conductive layer positioned above the substrate;
        a gap layer positioned above the first conductive layer;
        a dielectric layer positioned above the gap layer and the first conductive layer; and
        a second conductive layer positioned above the dielectric layer.

13. The slider as recited in claim 12, wherein the first conductive layer is configured to act as a bottom plate for the coupling capacitor, wherein the second conductive layer is configured to act as a top plate for the coupling capacitor, and wherein the dielectric layer has a thickness in a range from about 5 nm to about 100 nm.

14. The slider as recited in claim 13, further comprising an undercoat positioned between the substrate and the first conductive layer.

15. The slider as recited in claim 12, wherein the gap layer has physical characteristics of being formed full film, and wherein the gap layer is not positioned above all of the first conductive layer.

16. The slider as recited in claim 12, wherein the dielectric layer has physical characteristics of being formed via atomic layer deposition (ALD).

17. The slider as recited in claim 12, wherein the coupling capacitor is connected to the substrate using at least three connection points.

18. The slider as recited in claim 12, further comprising at least one common mode component coupled to the coupling capacitor.

19. The slider as recited in claim 12, further comprising a bleed resistor positioned in parallel with the coupling capacitor in a circuit between the substrate and the electronics ground of the slider, the bleed resistor having a resistance in a range from about 50 kΩ to about 300 kΩ.

20. A magnetic data storage system, comprising:
    at least one slider as recited in claim 12;
    a magnetic medium;
    a drive mechanism for passing the magnetic medium over the at least one slider; and
    a controller electrically coupled to the at least one slider for controlling operation of the magnetic head therein.

21. The magnetic data storage system as recited in claim 20, wherein the controller is configured to apply a negative bias to the at least one slider to reduce accumulation of contaminants on the at least one slider during use thereof.

22. A magnetic data storage system, comprising:
at least one slider, comprising:
- a substrate;
- a magnetic head; and
- a coupling capacitor configured to AC couple an electronics ground of the slider to the substrate and DC decouple the electronics ground of the slider from the substrate;

a magnetic medium;
a drive mechanism for passing the magnetic medium over the at least one slider; and
a controller electrically coupled to the at least one slider for controlling operation of the magnetic head therein, wherein the controller is configured to apply a negative bias to the at least one slider to reduce accumulation of contaminants on the at least one slider during use thereof.

23. The magnetic data storage system as recited in claim 22, wherein the at least one slider further comprises a bleed resistor positioned in parallel with the coupling capacitor in a circuit between the substrate and the electronics ground of the slider.

* * * * *